United States Patent
Takahashi

(10) Patent No.: US 10,892,242 B2
(45) Date of Patent: Jan. 12, 2021

(54) RESIN COMPOSITION, CONDUCTIVE COPPER PASTE, AND SEMICONDUCTOR DEVICE

(71) Applicant: NAMICS CORPORATION, Niigata (JP)

(72) Inventor: Tomoyuki Takahashi, Niigata (JP)

(73) Assignee: NAMICS CORPORATION, Niigata (JP)

(*) Notice: Subject to any disclaimer, the term of this patent is extended or adjusted under 35 U.S.C. 154(b) by 281 days.

(21) Appl. No.: 16/067,873

(22) PCT Filed: Jan. 11, 2017

(86) PCT No.: PCT/JP2017/000596
§ 371 (c)(1),
(2) Date: Jul. 3, 2018

(87) PCT Pub. No.: WO2017/126382
PCT Pub. Date: Jul. 27, 2017

(65) Prior Publication Data
US 2020/0266170 A1 Aug. 20, 2020

(30) Foreign Application Priority Data
Jan. 19, 2016 (JP) .................. 2016-007649

(51) Int. Cl.
| | | |
|---|---|---|
| *H01B 1/22* | (2006.01) |
| *C09D 5/24* | (2006.01) |
| *H01L 23/00* | (2006.01) |
| *C08K 3/08* | (2006.01) |
| *C08K 5/09* | (2006.01) |
| *C08K 5/17* | (2006.01) |
| *C08K 13/02* | (2006.01) |

(52) U.S. Cl.
CPC ............. *H01L 24/29* (2013.01); *C08K 3/08* (2013.01); *C08K 5/09* (2013.01); *C08K 5/17* (2013.01); *C08K 13/02* (2013.01); *H01B 1/22* (2013.01); *C08K 2003/085* (2013.01); *C08K 2201/001* (2013.01); *C08K 2201/005* (2013.01); *H01L 2224/2929* (2013.01); *H01L 2224/29347* (2013.01)

(58) Field of Classification Search
CPC ... H01B 1/00; H01B 1/20; H01B 1/22; C09D 5/24
See application file for complete search history.

(56) References Cited

U.S. PATENT DOCUMENTS

| | | | |
|---|---|---|---|
| 3,652,259 A * | 3/1972 | Knopp ................. | B22F 1/0048 75/342 |
| 4,937,016 A * | 6/1990 | Suehiro ................. | H05K 1/092 106/1.13 |
| 6,875,252 B2 * | 4/2005 | Sano ........................ | B22F 9/24 75/255 |
| 10,276,277 B2 * | 4/2019 | Takahashi ............... | H01L 24/27 |
| 2014/0203222 A1 * | 7/2014 | Ito ........................... | H01B 1/22 252/512 |
| 2018/0061520 A1 | 3/2018 | Kajita et al. | |

FOREIGN PATENT DOCUMENTS

| | | |
|---|---|---|
| JP | 2-16172 A | 1/1990 |
| JP | H03077202 A | 4/1991 |
| JP | H04145171 A | 5/1992 |
| JP | H05135619 A | 6/1993 |
| JP | H05212579 A | 8/1993 |
| JP | H05325634 A | 12/1993 |
| JP | H10064333 A | 3/1998 |
| JP | 2002343135 A | 11/2002 |
| JP | 2004169056 A | 6/2004 |
| JP | 2008130301 A | 6/2008 |
| JP | 2009295895 A | 12/2009 |
| WO | 2016140185 A1 | 9/2016 |
| WO | 2017029953 A1 | 2/2017 |

OTHER PUBLICATIONS

International Search Report dated Mar. 21, 2017 filed in PCT/JP2017/000596.
Wang et al., "Metallurgical Technology", Higher Education Press, China, Feb. 2011, Version 2, p. 51; English translation; Cited in Chinese Office Action (CNOA) dated Mar. 3, 2020 for corresponding Chinese Patent Application No. 201780005680.8.

* cited by examiner

*Primary Examiner* — Mark Kopec
(74) *Attorney, Agent, or Firm* — Rankin, Hill & Clark LLP

(57) ABSTRACT

An object of the present invention is to provide: a resin composition in which the specific resistance after curing is low regardless of the type of a thermosetting resin, and furthermore, the specific resistance after curing does not significantly change depending on the content of a copper powder; and a conductive copper paste including the resin composition. There are provided a resin composition including (A) a copper powder having an oxygen content of 0.3% by mass or less, (B) a thermosetting resin, (C) a fatty acid, and (D) an amine or an amine compound, as well as a conductive copper paste containing the resin composition. The (A) component has an average particle size of preferably 1 to 10 μm.

7 Claims, No Drawings ered. Moreover, since usable
RESIN COMPOSITION, CONDUCTIVE COPPER PASTE, AND SEMICONDUCTOR DEVICE

TECHNICAL FIELD

The present invention relates to a resin composition, a conductive copper paste, and a semiconductor device. In particular, the present invention relates to a resin composition, a conductive copper paste, and a semiconductor device, which have low specific resistance.

BACKGROUND ART

A semiconductor device in which the electrode portion of a semiconductor element and the conductive portion of a substrate are bonded to each other is very extensively used. For bonding the electrode portion of a semiconductor element and the conductive portion of a substrate, a conductive adhesive or soldering is used. The conductive adhesive has the advantage that bonding can be performed at a lower temperature than soldering. However, the specific resistance of the conductive adhesive is higher than that of solder. Therefore, studies are underway to reduce the resistance of the conductive adhesive.

Known conductive adhesives include silver as a conductive filler. However, since silver has migration properties and has increased in price, studies are underway to use copper as a conductive filler. The conductive adhesive including copper generally has the drawback that the specific resistance is high.

As a paste including copper as a conductive filler, there is disclosed a conductive copper paste containing as essential components a copper powder having a predetermined particle size distribution and tap density, a thermosetting resin, an organic carboxylic acid, and a chelate agent, and furthermore, polybutadiene (claim 1 and paragraphs 0013 and 0022 of PATENT LITERATURE 1).

This conductive copper paste is prepared such that it is a conductive copper paste which enables screen printing, has favorable conductivity comparable to a conductive silver paste, and possesses migration resistance properties, and which is suitable for through holes corresponding to fine pitches (paragraph 0008 of PATENT LITERATURE 1). It is disclosed that specific examples of the organic carboxylic acid may include salicylic acid, benzoic acid, tartaric acid, citric acid, maleic acid, succinic acid, fumaric acid, and malonic acid (paragraph 0018 of PATENT LITERATURE 1). All these organic carboxylic acids are solid at normal temperature.

Also, there is disclosed a conductive paste for circuit boards which includes a copper-containing metal powder, a compound containing at least two (meth) acryl groups, and a β-dicarbonyl compound, and which does not substantially contain an azo compound and a peroxide (claim 1 of PATENT LITERATURE 2). It is described that this conductive paste for circuit boards may include a compound having flux activity (paragraph 0014 of PATENT LITERATURE 2). An example of the compound having flux activity may include aliphatic carboxylic acids such as oleic acid (paragraphs 0038 and 0046 of PATENT LITERATURE 2).

Furthermore, there is disclosed a conductive copper paste composition which includes a prepolymer having at least two hydroxyl groups and at least one tertiary amine in one molecule, a copper powder, an amino resin, and a reducing agent, and which can be etched by an acidic etchant (claim 1 of PATENT LITERATURE 3). It is disclosed that an example of the reducing agent may include an unsaturated monocarboxylic acid having 12 to 23 carbon atoms, such as oleic acid and linoleic acid (paragraph 0016 of PATENT LITERATURE 3).

However, it is known that these conductive copper pastes have the following problems. That is, the specific resistance of the conductive copper pastes is likely to become high, and furthermore, significantly changes after curing depending on the content of a copper powder. Moreover, since usable resins are substantially limited (a resol-type phenolic resin according to PATENT LITERATURE 1, a compound having at least two (meth)acryl groups in one molecular according to PATENT LITERATURE 2, and a prepolymer having at least two hydroxyl groups and at least one tertiary amine in one molecule and an amino resin according to PATENT LITERATURE 3), applicable uses are limited.

CITATION LIST

Patent Literature

PATENT LITERATURE 1: JP-A-2008-130301
PATENT LITERATURE 2: JP-A-2009-295895
PATENT LITERATURE 3: JP-A-10-064333

SUMMARY OF THE INVENTION

Problems to be Solved by the Invention

The present inventors intensively conducted studies, and found that when a specific copper powder, a thermosetting resin, a fatty acid, and an amine or an amine compound are used in combination, there can be provided: a resin composition in which the specific resistance is low regardless of the type of the thermosetting resin, and the specific resistance of the conductive copper paste after curing does not significantly change depending on the content of the copper powder; and a conductive copper paste including the resin composition. That is, an object of the present invention is to provide: a resin composition in which the specific resistance after curing is low regardless of the type of a thermosetting resin and does not significantly change depending on the content of a copper powder; and a conductive copper paste including the resin composition.

Solution to the Problems

The present invention relates to a resin composition, a conductive copper paste, a cured product of a conductive copper paste, and a semiconductor device, which have solved the above-described problems by having the following configurations.

<1> A resin composition including (A) a copper powder having an oxygen content of 0.3% by mass or less, (B) a thermosetting resin, (C) a fatty acid, and (D) an amine or an amine compound.

<2> The resin composition according to the above-described <1>, in which the (A) component has an average particle size of 1 to 10 μm.

<3> The resin composition according to the above-described <1>, in which the (B) component is at least one selected from the group consisting of an epoxy resin, a phenolic resin, a melamine resin, a xylene resin, and a urea resin.

<4> The resin composition according to the above-described <1>, in which the (C) component is at least one selected from the group consisting of oleic acid, linoleic acid, linolenic acid, stearic acid, palmitic acid, and lauric acid.

<5> The resin composition according to the above-described <1>, in which the (D) component contains triethanolamine or 4,4'-diamino-3,3'-dimethyldiphenylmethane.
<6> A conductive copper paste including the resin composition according to the above-described <1>.
<7> A cured product of the conductive copper paste according to the above-described <6>.
<8> A semiconductor device including a cured product of the resin composition according to the above-described <1>.

Effects of the Invention

According to the present invention <1>, there can be provided a resin composition in which the specific resistance is low after curing regardless of the type of the thermosetting resin and does not significantly change after curing depending on the content of the copper powder (the specific resistance value is less than $1\times10^{-4}$ $\Omega\cdot$cm).

According to the present invention <6>, there can be provided a conductive copper paste including the resin composition in which the specific resistance is low after curing regardless of the type of the thermosetting resin and does not significantly change after curing depending on the content of the copper powder (the specific resistance value is less than $1\times10^{-4}$ $\Omega\cdot$cm). According to the invention <7>, there can be provided a cured product of a low-resistance conductive copper paste for obtaining a highly reliable semiconductor device. According to the invention <8>, there can be obtained a highly reliable semiconductor device which, for example, has a small connection resistance value between the electrode portion of a semiconductor element and the conductive portion of a substrate.

DESCRIPTION OF THE EMBODIMENTS

<Resin Composition>

The resin composition according to the present invention (hereinafter, referred to as the resin composition) includes (A) a copper powder having an oxygen content of 0.3% by mass or less, (B) a thermosetting resin, (C) a fatty acid, and (D) an amine or an amine compound.

The copper powder having an oxygen content of 0.3% by mass or less relative to 100% of the copper powder as the (A) component imparts conductivity to the resin composition after curing. The resin composition is advantageous in that the specific resistance after curing does not significantly change depending on the content of the (A) component. Here, the oxygen content of the copper powder is measured by hydrogen loss method. Specifically, an oxygen-nitrogen analyzer (Model: EMGA-623W) manufactured by Horiba, Ltd. is used for the measurement. It is noted that the oxygen content of the copper powder in the resin composition is measured after the copper powder is retrieved from the resin composition by solvent. Also, the (A) component preferably has an average particle size of 1 to 10 μm, from the viewpoint of the oxygen content and the specific resistance of the resin composition after curing. An example of the (A) component may include a copper powder having a rod-like, flake-like, or spherical shape. A more preferable example of the (A) component may be a rod-like copper powder obtained by crushing a particle-shaped dendritic copper powder (electrolytic copper powder). Also, it is preferable that the tap density of the (A) component is high from the viewpoint of the specific resistance of the resin composition after curing. Examples of a commercially available product of the (A) component may include: an electrolytic copper powder manufactured by Mitsui Mining & Smelting Co., Ltd. (ECY-4B, oxygen amount: 0.11%, specific surface area: 0.223 m$^2$/g, tap density: 4.65 g/cm$^3$, average particle size: 6.7 μm); an electrolytic copper powder manufactured by Mitsui Mining & Smelting Co., Ltd. (product name: ECY-4B large particle size product, oxygen amount: 0.08%, specific surface area: 0.258 m$^2$/g, tap density: 3.77 g/cm$^3$, average particle size: 10.9 μm); a liquid phase reduced copper powder manufactured by Mitsui Mining & Smelting Co., Ltd. (product name: CS-20D, oxygen amount: 0.27%, specific surface area: 0.339 m$^2$/g, tap density: 3.85 g/cm$^3$, average particle size: 2.9 μm); and a liquid phase reduced copper powder manufactured by Mitsui Mining & Smelting Co., Ltd. (product name: CS-10D, oxygen amount: 0.26%, specific surface area: 0.656 m$^2$/g, tap density: 4.55 g/cm$^3$, average particle size: 1.0 μm). The copper powder (ECY-4B) manufactured by Mitsui Mining & Smelting Co., Ltd. and the electrolytic copper powder (product name: ECY-4B large particle size product) manufactured by Mitsui Mining & Smelting Co., Ltd., which have a low oxygen content, are preferable. Here, measurement is performed for the specific surface area by BET method, for the tap density by a shaking specific gravity measuring device (tap machine), and for the average particle size by a laser diffraction scattering particle distribution measuring device. The (A) component may be used alone. Alternatively, two or more of the (A) components may be used in combination.

The thermosetting resin as the (B) component imparts adhesiveness and curing properties to the resin composition. In the resin composition, the specific resistance of the resin composition after curing can be lowered regardless of the type of the thermosetting resin. The (B) component is preferably, but not particularly limited to, at least one selected from the group consisting of an epoxy resin, a phenolic resin, a melamine resin, a xylene resin, and a urea resin, from the viewpoint of adhesive strength. Examples of a commercially available product of the (B) component may include: a bisphenol F-type epoxy resin manufactured by DIC Corporation (product name: EPICLON EXA-835LV); a bisphenol A-type epoxy resin manufactured by Asahi Kasei E-materials Corporation (product name: AER6072); a Novolac-type phenolic resin manufactured by Meiwa Plastic Industries, Ltd. (product name: MEH-8005); a Novolac-type phenolic resin manufactured by Gun Ei Chemical Industry Co., Ltd. (product name: Resitop PSM4324); a resol-type phenolic resin manufactured by Showa Highpolymer Co., Ltd. (product name: Shonol CKM-908); and a resol-type phenolic resin manufactured by Showa Highpolymer Co., Ltd. (product name: Shonol CKM-918A). The (B) component may be used alone. Alternatively, two or more of the (B) components may be used in combination. It is noted that solid resin such as a resol-type phenolic resin may be heated and mixed with the later-described diluent when preparing a paste so that it is used in a liquid state.

The (C) component functions as a flux component which allows an oxidized layer on the surface of the copper powder to be eluted. The (C) component is preferably at least one selected from the group consisting of oleic acid $(CH_3(CH_2)_7CH=CH(CH_2)_7COOH$, cis-9-octadecenoic acid, liquid), linoleic acid $(CH_3-(CH_2)_4-CH=CHCH_2CH=CH(CH_2)_7$ COOH, cis-9,
cis-12-octadecadienoic acid, liquid), linolenic acid $(CH_3CH_2CH=CHCH_2CH=CHCH_2CH=CH(CH_2)_7$
COOH, cis-9, cis-12,
cis-15-octadecatrienoic acid, liquid), stearic acid ($CH_3(CH_2)_{16}COOH$, octadecanoic acid, white solid),
palmitic acid ($CH_3(CH_2)_{14}COOH$, hexadecanoic acid, white solid), and
lauric acid ($CH_3(CH_2)_{10}COOH$, dodecanoic acid, white solid),
from the viewpoint of excellent wettability with the copper powder. Oleic acid is more preferable. The (C) component may be used alone. Alternatively, two or more of the (C) components may be used in combination.

The amine or the amine compound as the (D) component immobilizes copper ions eluted by the flux effect of the (C) component and suppresses the action of a carboxyl group of the fatty acid at room temperature (25° C.). The (D) component preferably contains triethanolamine (TEA, $N(CH_2CH_2OH)_3$) or 4,4'-diamino-3,3'-dimethyldiphenyl-methane. An example of a commercially available product of 4,4'-diamino-3,3'-dimethyldiphenylmethane may include an amine compound manufactured by Nippon Kayaku Co., Ltd. (product name: Kayahard AA). The (D) component may be used alone. Alternatively, two or more of the (D) components may be used in combination.

The content of the (A) component with respect to 100 parts by mass in total of the (A) component and the (B) component is preferably 80 to 98 parts by mass, more preferably 85 to 95 parts by mass, from the viewpoint of the adhesiveness of the resin composition and the specific resistance of the resin composition after curing.

In a cured product of the resin composition, the content of the (A) component with respect to 100 parts by mass in total of the (A) component and the (B) component is also preferably 80 to 98 parts by mass, more preferably 85 to 95 parts by mass. Here, the decrease in mass of the resin composition during curing is as low as less than 1%. Therefore, the preferable content of the (A) component in the cured product is similar to the content of the (A) component before curing. Here, quantitative analysis of the (A) component is performed by a thermogravimetric analyzer.

The content of the (B) component with respect to 100 parts by mass in total of the (A) component and the (B) component is preferably 2 to 20 parts by mass, more preferably 5 to 15 parts by mass, from the viewpoint of the curing properties of the resin composition and the specific resistance of the resin composition after curing.

In a cured product of the resin composition, the content of the (B) component with respect to 100 parts by mass in total of the (A) component and the (B) component is also preferably 2 to 20 parts by mass, more preferably 5 to 15 parts by mass. Here, quantitative analysis of the (B) component is performed by an ion chromatograph-mass spectrometer.

The content of the (C) component with respect to 100 parts by mass in total of the (A) component and the (B) component is preferably 1 to 3 parts by mass, more preferably 1 part by mass. When the content of the (C) component is less than 1 part by mass, the specific resistance value of the resin composition after curing is likely to become high. When the content of the (C) component is more than 3 parts by mass, the pot life of the resin composition is likely to become short.

In a cured product of the resin composition, the content of the (C) component with respect to 100 parts by mass in total of the (A) component and the (B) component is also more preferably 1 to 3 parts by mass. Here, quantitative analysis of the (C) component is performed by an ion chromatograph-mass spectrometer.

The content of the (D) component with respect to 100 parts by mass in total of the (A) component and the (B) component is preferably 1 to 3 parts by mass, more preferably 3 parts by mass. When the content of the (D) component is less than 1 part by mass, the pot life of the resin composition is likely to become short. When the content of the (D) component is more than 3 parts by mass, the specific resistance value of the resin composition after curing is likely to become high.

The resin composition may further include a diluent, from the viewpoint of melting or liquefaction when the (B) component is solid, and preparation of the viscosity of the resin composition. The diluent can be appropriately selected in consideration of the solubility and curing condition of the thermosetting resin. Specific examples of the diluent may include ethyl carbitol, ethyl carbitol acetate, butyl carbitol, butyl carbitol acetate, terpineol, dihydroterpineol, ethyl cellosolve, butyl cellosolve, ethyl cellosolve acetate, butyl cellosolve acetate, and phenoxyethanol. From the viewpoint of the drying properties of the resin composition, phenoxyethanol manufactured by Toho Chemical Industry Co., Ltd. (product name: HISOLV EPH) is preferably used.

The content of the diluent with respect to 100 parts by mass of the resin composition is preferably 10 to 20 parts by mass.

As long as the object of the present invention is not impaired, the resin composition according to the present invention may further include additives as necessary, for example, a curing accelerator such as imidazole (for instance, 2-phenyl-4-methyl-5-hydroxymethylimidazole manufactured by Shikoku Chemicals Corporation (product name: CUREZOL 2P4MHZ-PW)), a wet dispersant such as carboxylic acid salt (for instance, a dispersant manufactured by Croda International Plc (product name: Hypermer KD-57)), a leveling agent, a coloring agent, an ion trapping agent, an antifoaming agent, and a flame retardant.

The resin composition according to the present invention can be obtained by, for example, simultaneously or separately stirring, melting, mixing and dispersing the (A) to (D) components, additives, and the like, while performing heat treatment as necessary. An apparatus for these mixing, stirring, dispersing, and the like is not particularly limited. Examples of such an apparatus to be used may include a kneader, a three-roll mill, a ball mill, a planetary mixer, a bead mill, and the like which are equipped with a stirrer and a heater. Also, an appropriate combination of these apparatuses may be used.

The initial viscosity of the resin composition is preferably 20 to 25 Pa·s, from the viewpoint of screen printing properties. Here, the initial viscosity of the resin composition is measured within 24 hours after the resin composition has been prepared, at 25° C. with 10 rotations using a Brookfield-type viscometer (Model No.: HBDV-1, No. 14 rotor).

The resin composition according to the present invention is formed or coated on a desired position of an electronic component, such as on the conductive portion of a substrate and the electrode portion of a semiconductor element, by screen printing or a dispenser.

The curing condition of the resin composition according to the present invention is preferably 150 to 300° C. for 5 to 30 minutes, particularly suitably high temperature for a short period at 200 to 220° C. for 20 to 40 minutes. A cured product of the resin composition has low specific resistance.

The resin composition according to the present invention is suitable for conductive copper pastes, and is suitable as an adhesive for electronic components, such as between the electrode portion of a semiconductor element and the conductive portion of a substrate.

<Semiconductor Device>

The semiconductor device according to the present invention includes a cured product of the above-described resin composition, that is, a cured product of a conductive copper paste. The semiconductor device also includes, for example, a substrate having a conductive portion and a semiconductor element having an electrode portion. The conductive portion of a substrate and the electrode portion of a semiconductor element are connected via a cured film of a resin composition which is a cured product of the above-described resin composition.

The semiconductor device according to the present invention has a small connection resistance value between the electrode portion of a semiconductor element and the conductive portion of a substrate. Therefore, the semiconductor device according to the present invention has high reliability.

EXAMPLES

The present invention will be described by way of examples. However, the present invention is not limited to these examples. It is noted that in the following examples, parts and % indicate parts by mass and % by mass respectively, unless otherwise stated.

In Examples and Comparative Examples,
there were used as the (A) component: an electrolytic copper powder manufactured by Mitsui Mining & Smelting Co., Ltd. (product name: ECY-4B large particle size product, oxygen amount: 0.08%, specific surface area: 0.258 $m^2/g$, tap density: 3.77 $g/cm^3$, average particle size: 10.9 μm); an electrolytic copper powder manufactured by Mitsui Mining & Smelting Co., Ltd. (product name: ECY-4B, oxygen amount: 0.11%, specific surface area: 0.223 $m^2/g$, tap density: 4.65 $g/cm^3$, average particle size: 6.7 μm); a liquid phase reduced copper powder manufactured by Mitsui Mining & Smelting Co., Ltd.
(product name: CS-20D, oxygen amount: 0.27%, specific surface area: 0.339 $m^2/g$, tap density: 3.85 $g/cm^3$, average particle size: 2.9 μm); and a liquid phase reduced copper powder manufactured by Mitsui Mining & Smelting Co., Ltd. (product name: CS-10D, oxygen amount: 0.26%, specific surface area: 0.656 $m^2/g$, tap density: 4.55 $g/cm^3$, average particle size: 1.0 μm). It is noted that there was also used the (A) component having an oxygen amount of 0.21%, a specific surface area of 0.252 $m^2/g$, and a tap density of 4.44 $g/cm^3$ obtained by oxidizing an electrolytic copper powder manufactured by Mitsui Mining & Smelting Co., Ltd. (product name: ECY-4B) in the atmosphere at 100° C. for 15 hours. Furthermore, there was also used the (A) component having an oxygen amount of 0.47%, a specific surface area of 0.446 $m^2/g$, and a tap density of 4.08 $g/cm^3$ obtained by oxidizing an electrolytic copper powder manufactured by Mitsui Mining & Smelting Co., Ltd. (product name: ECY-4B) in the atmosphere at 100° C. for 550 hours.
As the (B) component, there were used: a bisphenol F-type epoxy resin manufactured by DIC Corporation (product name: EPICLON EXA-835LV); a bisphenol A-type epoxy resin manufactured by Asahi Kasei E-materials Corporation (product name: AER6072); a Novolac-type phenolic resin manufactured by Meiwa Plastic Industries, Ltd. (product name: MEH-8005); a Novolac-type phenolic resin manufactured by Gun Ei Chemical Industry Co., Ltd. (product name: Resitop PSM4324); a resol-type phenolic resin manufactured by Showa Denko K.K. (product name: Shonol CKM-908); and a resol-type phenolic resin manufactured by Showa Denko K.K. (product name: Shonol CKM-918A).
As the (C) component, there were used oleic acid and stearic acid manufactured by Wako Pure Chemical Industries, Ltd.
As the (D) component, there were used triethanolamine manufactured by Wako Pure Chemical Industries, Ltd. (TEA, 2,2',2"-nitrilotriethanol) and amine 4,4'-diamino-3,3'-dimethyldiphenylmethane manufactured by Nippon Kayaku Co., Ltd. (product name: Kayahard AA).

There were used: imidazole manufactured by Shikoku Chemicals Corporation (2-phenyl-4-methyl-5-hydroxymethylimidazole, product name: CUREZOL 2P4MHZ-PW) as a curing accelerator; a dispersant manufactured by Croda International Plc. (product name: Hypermer KD-57) as a dispersant; and a diluent manufactured by Toho Chemical Industry Co., Ltd. (product name: HISOLV EPH) as a diluent.

Examples 1 to 30, Comparative Examples 1 to 8

Resin compositions were prepared by uniformly mixing and kneading a raw material by a three-roll mill at ratios illustrated in Tables 1 to 5. The (A) component, the (B) component, the (C) component, and the (D) component were uniformly mixed and kneaded by a three-roll mill to prepare a resin composition. Lastly, the viscosity was measured by a Brookfield-type viscometer (Model No.: HBDV-1, No. 14 rotor, 10 rpm). A diluent was added such that the measured viscosity became 20 to 25 Pa·s. It is noted that when the (B) component was solid and was difficult to mix and knead, the (B) component was previously dissolved in part of a diluent, and thereafter other components were mixed and kneaded.
<Evaluation Method>
<<Measurement of Initial Viscosity>>

The resin composition was measured within 24 hours after it has been prepared, at 25° C. with 10 rotations using a Brookfield-type viscometer (HBDV-1, No. 14 rotor).
<<Measurement of Specific Resistance Value>>

A pattern having a width of 1 mm and a length of 71 mm was printed with the resin composition on an alumina substrate using a screen printer. The printed resin composition was subjected to heat treatment in a nitrogen atmosphere at 200° C.×30 minutes by a belt conveyor curing oven so that it was cured. The thickness of the obtained cured film of the resin composition was measured using a surface texture and shape measuring instrument manufactured by Tokyo Seimitsu Co., Ltd. (Model No.: Surfcom 1500SD-2). The resistance value was measured using a digital multimeter manufactured by TFF Keithley Instruments, Inc. (Model No.: 2001). The volume resistivity was calculated as the specific resistance value.

TABLE 1

|  |  |  | Example 1 | Example 2 | Example 3 | Example 4 | Example 5 | Comparative Example 1 | Comparative Example 2 | Comparative Example 3 | Comparative Example 4 | Comparative Example 5 |
|---|---|---|---|---|---|---|---|---|---|---|---|---|
| (A) Cu powder | ECY-4B | $O_2$:0.1% | 87.5 | 90.0 | 92.5 | 95.0 | 0 | 0 | 0 | 0 | 0 | 0 |
|  |  | $O_2$:0.2% | 0 | 0 | 0 | 0 | 90.0 | 0 | 0 | 0 | 0 | 0 |
|  |  | $O_2$:0.47% | 0 | 0 | 0 | 0 | 0 | 85.0 | 87.5 | 90.0 | 92.5 | 95.0 |

TABLE 1-continued

|  |  | Example 1 | Example 2 | Example 3 | Example 4 | Example 5 | Comparative Example 1 | Comparative Example 2 | Comparative Example 3 | Comparative Example 4 | Comparative Example 5 |
|---|---|---|---|---|---|---|---|---|---|---|---|
| (B) Resol-type phenol | CKM 918A | 12.5 | 10.0 | 7.5 | 5.0 | 10.0 | 15.0 | 12.5 | 10.0 | 7.5 | 5.0 |
| (C) Fatty acid | Oleic acid | 1.0 | 1.0 | 1.0 | 1.0 | 1.0 | 1.0 | 1.0 | 1.0 | 1.0 | 1.0 |
| (D) Amine | TEA | 3.0 | 3.0 | 3.0 | 3.0 | 3.0 | 3.0 | 3.0 | 3.0 | 3.0 | 3.0 |
| Diluent | EPH | 16.7 | 16.3 | 13.0 | 15.7 | 15.8 | 21.0 | 18.5 | 15.0 | 13.5 | 11.2 |
| Viscosity measured at 10 rpm (Pa·s) |  | 23 | 25 | 24 | 24 | 25 | 23 | 21 | 25 | 22 | 25 |
| Specific resistance value (μΩ·cm) after curing at 200° C. × 30 min (N$_2$) |  | 76 | 59 | 72 | 58 | 117 | Measurement disabled | Measurement disabled | Measurement disabled | Measurement disabled | Measurement disabled |

TABLE 2

|  |  | Example 6 | Example 7 | Example 8 | Example 9 | Example 10 | Example 11 | Example 12 | Example 13 | Example 14 |
|---|---|---|---|---|---|---|---|---|---|---|
| (A) Cu powder | ECY-4B Large particle size product (O$_2$: 0.08%) | 85.0 | 87.5 | 90.0 | 92.5 | 95.0 | 0 | 0 | 0 | 0 |
|  | ECY-4B (O$_2$: 0.03%) | 0 | 0 | 0 | 0 | 0 | 87.5 | 90.0 | 92.5 | 95.0 |
| (B) Resol-type phenolic resin | CKM 918A | 15.0 | 12.5 | 10.0 | 7.5 | 5.0 | 12.5 | 10.0 | 7.7 | 5.0 |
| (C) Fatty acid | Oleic acid | 1.0 | 1.0 | 1.0 | 1.0 | 1.0 | 1.0 | 1.0 | 1.0 | 1.0 |
| (D) Amine | TEA | 3.0 | 3.0 | 3.0 | 3.0 | 3.0 | 3.0 | 3.0 | 3.0 | 3.0 |
| Diluent | EPH | 19.0 | 16.7 | 16.3 | 13.0 | 15.7 | 16.7 | 16.3 | 13.0 | 15.7 |
| Viscosity (measured at 10 rpm (Pa·s)) |  | 25 | 25 | 20 | 23 | 20 | 23 | 25 | 24 | 24 |
| Specific resistance value (μΩ·cm) after curing at 200° C. × 30 min (N$_2$) |  | 61 | 56 | 49 | 62 | 50 | 76 | 59 | 72 | 58 |

TABLE 3

|  |  | Example 15 | Example 16 | Example 17 | Example 18 | Example 19 | Example 20 | Example 21 | Example 22 | Example 23 | Example 24 |
|---|---|---|---|---|---|---|---|---|---|---|---|
| (A) Cu powder | CS-20D (O$_2$: 0.27%) | 85.0 | 87.5 | 90.0 | 92.5 | 95.0 | 0 | 0 | 0 | 0 | 0 |
|  | CS-10D (O$_2$: 0.26%) | 0 | 0 | 0 | 0 | 0 | 85.0 | 87.5 | 90.0 | 92.5 | 95.0 |
| (B) Resol-type phenolic resin | CKM 918A | 15.0 | 12.5 | 10.0 | 7.7 | 5.0 | 15.0 | 2.5 | 10.0 | 7.5 | 5.0 |
| (C) Fatty acid | Oleic acid | 1.0 | 1.0 | 1.0 | 1.0 | 1.0 | 1.0 | 1.0 | 1.0 | 1.0 | 1.0 |
| (D) Amine | TEA | 3.0 | 3.0 | 3.0 | 3.0 | 3.0 | 3.0 | 3.0 | 3.0 | 3.0 | 3.0 |
| Diluent | EPH | 19.0 | 18.7 | 15.8 | 15.0 | 11.7 | 19.0 | 17.5 | 15.8 | 14.3 | 12.7 |
| Viscosity (measured at 10 rpm (Pa·s)) |  | 22 | 23 | 24 | 22 | 22 | 23 | 24 | 24 | 23 | 24 |

TABLE 3-continued

| | Example 15 | Example 16 | Example 17 | Example 18 | Example 19 | Example 20 | Example 21 | Example 22 | Example 23 | Example 24 |
|---|---|---|---|---|---|---|---|---|---|---|
| Specific resistance value ($\mu\Omega \cdot$ cm) after curing at 200° C. × 30 min ($N_2$) | 109 | 56 | 30 | 23 | 42 | 40 | 26 | 16 | 18 | 30 |

TABLE 4

| | | | Example 2 | Example 25 | Example 26 | Example 27 |
|---|---|---|---|---|---|---|
| (A) Cu powder | | ECY-4B | 90.0 | 90.0 | 90.0 | 90.0 |
| (B) Component | Bis F-type epoxy resin | EXA835LV | 0 | 5.0 | 5.5 | 0 |
| | Bis A-type epoxy resin | AER6072 | 0 | 0 | 0 | 8.1 |
| | Novolac-type phenol | MEH8005 | 0 | 0 | 4.5 | 0 |
| | | PSM4324 | 0 | 0 | 0 | 1.9 |
| | Resol-type phenol | CKM908 | 0 | 5.0 | 0 | 0 |
| | | CKM918A | 10.0 | 0 | 0 | 0 |
| (C) Fatty acid | | Oleic acid | 1.0 | 0 | 0 | 0 |
| | | Stearic acid | 0 | 1.0 | 1.0 | 1.0 |
| (D) Component | | TEA | 3.0 | 0 | 3.0 | 3.0 |
| | | Kayahard AA | 0 | 1.5 | 0 | 0 |
| Curing accelerator | | 2P4MHZ | 0 | 0.3 | 0.3 | 0.3 |
| Dispersant | | Hypermer KD-57 | 0 | 0.5 | 0.5 | 0.5 |
| Diluent | | EPH | 16.3 | 8.9 | 8.0 | 20.2 |
| Viscosity (measured at 10 rpm (Pa · s)) | | | 25 | 23 | 20 | 14 |
| Specific resistance value ($\mu\Omega \cdot$ cm) after curing at 200° C. × 30 min ($N_2$) | | | 59 | 111 | 116 | 98 |

TABLE 5

| | | Comparative Example 6 | Comparative Example 7 | Comparative Example 8 | Example 28 | Example 29 | Example 30 |
|---|---|---|---|---|---|---|---|
| (A) Cu powder | ECY-4B | 90.0 | 90.0 | 90.0 | 90.0 | 90.0 | 90.0 |
| (B) Resol-type phenolic resin | CKM 918A | 10.00 | 10.0 | 10.0 | 10.0 | 10.0 | 10.0 |
| (C) Fatty acid | Oleic acid | 0 | 1.0 | 0 | 3.0 | 3.0 | 1.0 |
| (D) Amine | TEA | 0 | 0 | 3.0 | 3.0 | 3.0 | 1.0 |
| Diluent | EPH | 6.5 | 6.5 | 7.0 | 7.0 | 6.5 | 7.0 |
| Viscosity (measured at 10 rpm (Pa · s)) | | 21 | 25 | 20 | 25 | 20 | 24 |
| Specific resistance value ($\mu\Omega \cdot$ cm) after curing at 200° C. × 30 min ($N_2$) | | 2722 | 636 | 1258 | 59 | 34 | 123 |

As understood from Tables 1 to 3, in all of Examples 1 to 24, the specific resistance value of the resin composition after curing was less than $1\times10^4$ $\Omega$·cm. On the contrary, in all of Comparative Examples 1 to 5 in which a copper powder having a high oxygen content was used, the specific resistance value of the resin composition after curing was high.

As understood from Examples 2 and 25 to 26 in Table 4, the specific resistance values of all the resin compositions after curing were less than $1\times10^4$ $\Omega$·cm even when the (B) component, the (C) component, or the (D) component was varied.

As understood from Table 5, the specific resistance values of the resin compositions after curing in Examples 28 to 30 were less than $1\times10^4$ $\Omega$·cm. On the contrary, in all of Comparative Example 6 without the (C) component and the (D) component, Comparative Example 7 without the (D) component, and Comparative Example 8 without the (C) component, the specific resistance value of the resin composition after curing was high.

As described above, according to the resin composition according to the present invention, the specific resistance after curing is low regardless of the type of the thermosetting resin, and furthermore, does not significantly change after curing depending on the content of the copper powder. Therefore, the resin composition according to the present invention is extraordinarily useful as a conductive copper paste.

The invention claimed is:
1. A resin composition, comprising:
   (A) a copper powder having an oxygen content of 0.3% by mass or less;
   (B) a thermosetting resin;
   (C) a fatty acid; and
   (D) an amine or an amine compound,
   wherein the (B) component is at least one selected from the group consisting of an epoxy resin, a Novolac-type phenolic resin, a melamine resin, a xylene resin, and a urea resin.
2. The resin composition according to claim 1, wherein the (A) component has an average particle size of 1 to 10 μm.
3. The resin composition according to claim 1, wherein the (C) component is at least one selected from the group consisting of oleic acid, linoleic acid, linolenic acid, stearic acid, palmitic acid, and lauric acid.
4. The resin composition according to claim 1, wherein the (D) component includes triethanolamine or 4,4'-diamino-3,3'-dimethyldiphenylmethane.
5. A conductive copper paste comprising the resin composition according to claim 1.
6. A cured product of the conductive copper paste according to claim 5.
7. A semiconductor device containing a cured product of the resin composition according to claim 1.

* * * * *